(12) United States Patent
Kim et al.

(10) Patent No.: US 9,615,041 B2
(45) Date of Patent: Apr. 4, 2017

(54) IMAGE SENSOR AND METHOD OF MANUFACTURING THE SAME

(71) Applicant: SAMSUNG ELECTRONICS CO., LTD., Suwon-si, Gyeonggi-Do (KR)

(72) Inventors: Seung-Sik Kim, Hwaseong-si (KR); Young-Chan Kim, Seongnam-si (KR); Tae-Han Kim, Suwon-si (KR); Eun-Sub Shim, Anyang-si (KR); Dong-Joo Yang, Seongnam-si (KR); Min-Seok Oh, Osan-si (KR); Moo-Sup Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 14/607,133

(22) Filed: Jan. 28, 2015

(65) Prior Publication Data
US 2015/0256769 A1 Sep. 10, 2015

(30) Foreign Application Priority Data

Mar. 10, 2014 (KR) .................. 10-2014-0027949

(51) Int. Cl.
*H04N 5/3745* (2011.01)
*H01L 27/30* (2006.01)
*H01L 27/146* (2006.01)
*H01L 27/148* (2006.01)

(52) U.S. Cl.
CPC ....... *H04N 5/3745* (2013.01); *H01L 27/1461* (2013.01); *H01L 27/1464* (2013.01); *H01L 27/14607* (2013.01); *H01L 27/14612* (2013.01); *H01L 27/14621* (2013.01); *H01L 27/14623* (2013.01); *H01L 27/14627* (2013.01); *H01L 27/14645* (2013.01); *H01L 27/14812* (2013.01); *H01L 27/14818* (2013.01); *H01L 27/307* (2013.01)

(58) Field of Classification Search
None
See application file for complete search history.

(56) References Cited

U.S. PATENT DOCUMENTS

| | | | |
|---|---|---|---|
| 7,642,581 B2 | 1/2010 | Inoue | |
| 7,759,151 B2 | 7/2010 | Matsuda et al. | |
| 8,492,864 B2 | 7/2013 | Watanabe | |
| 2009/0201400 A1 | 8/2009 | Zhang et al. | |
| 2010/0084728 A1 | 4/2010 | Yamada | |
| 2011/0242376 A1 | 10/2011 | Ando | |
| 2012/0009720 A1* | 1/2012 | Shim | H01L 27/14625 438/70 |

(Continued)

FOREIGN PATENT DOCUMENTS

KR 1020070027909 A 3/2007

*Primary Examiner* — Mark T Monk
(74) *Attorney, Agent, or Firm* — Volentine & Whitt, PLLC

(57) ABSTRACT

Provided are an image sensor and a method of manufacturing the same. The method may include forming a photoelectric conversion region and a charge storage region in a semiconductor layer; forming a transistor on a front surface of the semiconductor layer; forming a recess by etching a portion of the semiconductor layer between the charge storage region and a rear surface of the semiconductor layer; and forming on a bottom surface of the recess a shield film that blocks light incident on the charge storage region.

20 Claims, 16 Drawing Sheets

(56) References Cited

U.S. PATENT DOCUMENTS

2012/0300106 A1* 11/2012 Kobayashi ........ H01L 27/14603
348/308
2013/0070131 A1 3/2013 Ohkubo et al.
2013/0207212 A1 8/2013 Mao et al.

* cited by examiner

IMAGE SENSOR AND METHOD OF MANUFACTURING THE SAME

CROSS-REFERENCE TO RELATED APPLICATIONS

A claim of priority under 35 U.S.C. §119 is made to Korean Patent Application No. 10-2014-0027949, filed on Mar. 10, 2014, the entire contents of which are hereby incorporated by reference.

BACKGROUND

The inventive concept relates to an image sensor and a method of manufacturing the same, and more particularly, to an image sensor that supports a global shutter and a method of manufacturing the image sensor.

Image sensors that capture an image and convert the image into an electrical signal are used not only in general consumer electronic devices such as digital cameras, mobile phone cameras, or portable camcorders, but also in cameras that are mounted on vehicles, security systems, or robots. Image sensors may include a pixel array, and each unit pixel included in the pixel array may include a photo-electric conversion region. The photo-electric conversion region may generate an electrical signal according to an intensity of absorbed light. A photodiode, that is an example of a photo-electric conversion region, may generate current by absorbing light.

In general, image sensors may be produced by semiconductor manufacturing processes. Image sensors may include not only a photo-electric conversion region, but also a transistor for controlling the photo-electric conversion region and circuits for driving the pixel array. Each element of an image sensor may be formed by semiconductor manufacturing processes. There is known a backside illumination (BSI) sensor characterized in that a transistor and a wiring layer are formed on one surface of a semiconductor layer on which the photo-electric conversion region is formed, and light is incident on the other surface of the semiconductor layer.

SUMMARY

The present inventive concept provides an image sensor that supports a global shutter by blocking a part of incident light and a method of manufacturing the image sensor.

In embodiments of the inventive concept, there is provided a method of manufacturing an image sensor. The method may include forming a photo-electric conversion region and a charge storage region in a semiconductor layer, forming a transistor on a front surface of the semiconductor layer, forming a recess by etching a portion of the semiconductor layer between the charge storage region and a rear surface of the semiconductor layer, and forming on or above a bottom surface of the recess a shield film that blocks light incident on the charge storage region.

The method may further include forming a material layer on the shield film and the rear surface of the semiconductor layer, forming a color filter layer on the material layer, and forming a lens on the color filter layer.

The forming of the shield film may include forming the shield film on or above the bottom surface of the recess and a side wall of the recess.

The forming of the shield film may include forming the shield film on a portion of the rear surface of the semiconductor layer other than a portion through which the light incident on the photo-electric conversion region passes.

The semiconductor layer may include a floating diffusion region, wherein the forming of the recess includes further etching a portion of the semiconductor layer between the floating diffusion region and the rear surface of the semiconductor layer.

The shield film may include a metal.

The method may further include forming an insulating film on the bottom of the recess before the forming of the shield film.

In other embodiments of the inventive concept, there is provided an image sensor including a color filter layer, a photo-electric conversion region that accumulates electric charges according to light which passes through the color filter layer and which is incident and is spaced apart from a first surface of the color filter layer by a first distance, a charge storage region that stores the accumulated electric charges and is spaced apart from the first surface of the color filter layer by a second distance, and a shield film that blocks light incident on the charge storage region and is disposed between the color filter layer and the charge storage region. The second distance is greater than the first distance, and the shield film is spaced apart from the first surface of the color filter layer by a distance that is greater than the first distance.

The shield film may extend toward the first surface of the color filter layer along a side surface of the photo-electric conversion region.

The shield film may include an opening through which the light incident on the photo-electric conversion region passes. The opening is disposed between the color filter layer and the photo-electric conversion region.

The image sensor may further include an insulating film that is disposed between the charge storage region and the shield film.

The image sensor may further include a material layer that is disposed between the shield film and the color filter layer, and a lens that is disposed on a second surface of the color filter layer that faces the first surface of the color filter layer.

The image sensor may further include a floating diffusion region to which the electric charges stored in the charge storage region are transmitted. The floating diffusion region is spaced apart from the first surface of the color filter layer. The shield film may extend to be disposed between the floating diffusion region and the color filter layer.

The shield film may include a metal.

The image sensor may further include an organic photo-electric conversion layer that is disposed on the second surface of the color filter layer that faces the first surface of the color filter layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Various embodiments will now be described more fully with reference to the accompanying drawings in which some embodiments are shown. These embodiments are provided so that this disclosure is thorough and complete and fully conveys the inventive concept to those skilled in the art.

Figure 1:
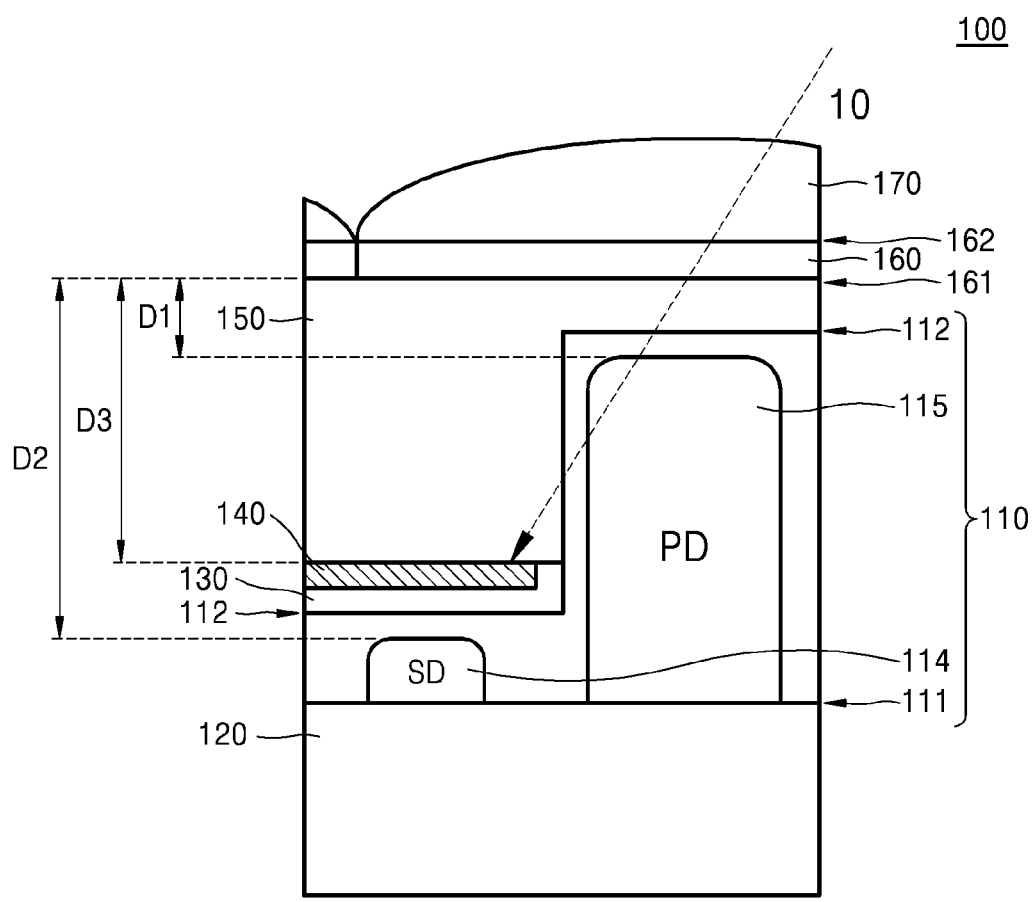
FIG. 1 is a cross-sectional view illustrating a unit pixel included in an image sensor, according to an embodiment of the inventive concept.

FIG. 1 is a cross-sectional view illustrating a unit pixel 100 included in an image sensor, according to an embodiment of the inventive concept. As shown in FIG. 1, the unit pixel 100 may include a semiconductor layer 110, a transistor layer 120, an insulating film 130, a shield film 140, a material layer 150, a color filter layer 160, and a lens layer 170. The semiconductor layer 110 may have a top surface 112 and a bottom surface 111 that face each other, and the transistor layer 120 may be formed to contact the bottom surface 111 of the semiconductor layer 110. Herein, the top surface 112 of the semiconductor layer 110 may be referred to as a rear surface of the semiconductor layer 110, and the bottom surface 111 of the semiconductor layer 110 may be referred to as a front surface of the semiconductor layer 110. Although not shown in FIG. 1, the unit pixel 100 may further include a wiring layer that includes a plurality of wirings each formed of a conductive material and is formed on one surface of the transistor layer 120 that faces a surface of the transistor layer 120 that contacts the bottom surface 111 of the semiconductor layer 110. Each of the semiconductor layer 110 and the transistor layer 120 may be formed from any one of, for example, a bulk substrate, an epitaxial substrate, and a silicon-on-insulator (SOI) substrate.

The material layer 150, the color filter layer 160, and the lens layer 170 may be formed by being sequentially stacked on the top surface 112 of the semiconductor layer 110. The lens layer 170 may be referred to as a micro lens layer and may be disposed on a top surface 162 of the color filter layer 160. The lens layer 170 may focus incident light on a photo-electric conversion region 115. The color filter layer 160 may pass therethrough only light having a necessary wavelength among the light incident through the lens layer 170 and may enable the light having the necessary wavelength to be incident on the photo-electric conversion region 115.

The material layer 150 may be a passivation layer for protecting the semiconductor layer 110 and may insulate the semiconductor layer 110 from an external material (for example, the color filter layer 160). Also, the material layer 150 may prevent light scattering or light reflection, and the material layer 150 may be formed as a multi-layer film obtained by stacking materials having different refractive indices. Examples of the material layer 150 may include a film obtained by stacking an oxide film and a nitride film (e.g., an oxide film/nitride film or a nitride film/oxide film), and a film obtained by an oxide film and a carbon-containing film (e.g., an SiC film, an oxide film/SiC or an SiC/oxide film). In particular, the oxide film may be formed as any one film among a borophosphosilicate glass (BPSG) film, a phosphosilicate glass (PSG) film, a borosilicate glass (BSG) film, an un-doped silicate glass (USG) film, a tetra ethyl ortho silicate (TEOS) film, and a high density plasma (HDP) film. The nitride film may be a silicon nitride ($Si_xN_y$, where x and y are natural numbers) film or a silicon oxynitride ($Si_xO_yN_z$, where x, y, and z are natural numbers) film.

As shown in FIG. 1, the semiconductor layer 110 may include the photo-electric conversion region 115 and a charge storage region 114. The photo-electric conversion region 115 and the charge storage region 114 may contact the bottom surface 111 of the semiconductor layer 110. According to an embodiment of the inventive concept, the photo-electric conversion region 115 may be a photodiode. The photodiode may generate current by absorbing light that is incident through the lens layer 170, the color filter layer 160, and the material layer 150. While the photo-electric conversion region 115 absorbs light, when a charge transfer path between the photo-electric conversion region 115 and the outside is blocked, electric charges according to the current that is generated by the photo-electric conversion region 115 may be accumulated in the photo-electric conversion region 115. Since the electric charges that are accumulated in the photo-electric conversion region 115 are increased according to an intensity of absorbed light by the photo-electric conversion region 115, the intensity of the absorbed light may be detected by using the electric charges that are accumulated in the photo-electric conversion region 115.

The charge storage region 114 may temporarily store the electric charges that are generated as the photo-electric conversion region 115 absorbs the light. The image sensor may include a pixel array including a plurality of the unit pixels 100 and may control the pixel array by using a global shutter method. In order to support a global shutter, the unit pixel 100 may include a charge storage region that temporarily stores the electric charges that are accumulated in the photo-electric conversion region 115. For example, as shown in FIG. 1, the unit pixel 100 may include the charge storage region 114 in order to store the electric charges. The global shutter will be explained below. According to an embodiment of the inventive concept, the unit pixel 100 may include the shield film 140 that blocks light 10 that is incident on the charge storage region 114. The light 10 that is incident on the charge storage region 114 may affect the number of the electric charges that are stored in the charge storage region 114. According to an embodiment of the inventive concept, the charge storage region 114 may be a diode that is formed by introducing (for example, diffusing or injecting) dopants. The charge storage region 114 may accumulate the electric charges according to the light that is absorbed. Thus, the number of the electric charges that are temporarily stored in the charge storage region 114 and then are sent to the outside of the unit pixel 100 may be different from the number of the electric charges that are accumulated in the photo-electric conversion region 115. The shield film 140 may reduce the difference by blocking the light 10 that is incident on the charge storage region 114. The shield film 140 may include a material through which light does not pass, for example, a metal or an alloy film obtained by combining two or more metals.

As shown in FIG. 1, a height of the charge storage region 114 (that is, a vertical length of the charge storage region 114 in FIG. 1) may be less than a height of the photo-electric conversion region 115 (that is, a vertical length of the photo-electric conversion region 115 in FIG. 1). A range of intensities of light that may be detected by the image sensor is referred to as a dynamic range, and the dynamic range is one of the factors indicating the performance of the image sensor. The image sensor having a wide dynamic range may detect light having a lower intensity and light having a higher intensity, and may output an electrical signal corresponding to a detected intensity. In order to increase the dynamic range of the image sensor, a size of the photo-electric conversion region 115 that absorbs the light and accumulates the electric charges may be increased. That is, since the photo-electric conversion region 115 having a greater size has a greater capacity for accumulating the electric charges, the dynamic range of the image sensor may be increased. Accordingly, the photo-electric conversion region 115 may be larger than the charge storage region 114. As shown in FIG. 1, the height of the photo-electric conversion region 115 (that is, a distance between the bottom surface 111 of the semiconductor layer 110 and a top surface of the photo-electric conversion region 115) may be greater than the height of the charge storage region 114 (that is, a distance between the bottom surface 111 of the semiconductor layer 110 and a top surface of the charge storage region 114).

According to an embodiment of the inventive concept, the photo-electric conversion region 115 may be spaced apart from a bottom surface 161 of the color filter layer 160 by a first distance D1, and the charge storage region 114 may be spaced apart from the bottom surface 161 of the color filter layer 160 by a second distance D2 that is greater than the first distance D1. As shown in FIG. 1, the shield film 140 may be disposed between the color filter layer 160 and the charge storage region 114 and may be spaced apart from the bottom surface 161 of the color filter layer 160 by a third distance D3 that is greater than the first distance D1. That is, the shield film 140 may be spaced apart from the bottom surface 161 of the color filter layer 160 by the third distance D3 that is greater than the first distance D1 between the bottom surface 161 of the color filter layer 160 and the photo-electric conversion region 115 and is less than the second distance D2 between the bottom surface 161 of the color filter layer 160 and the charge storage region 114. The shield film 140 may block the more of the light 10 that is incident on the charge storage region 114 by being disposed closer to the charge storage region 114. The shield film 140 may be spaced about 0.2 μm to about 1 μm apart from the front surface 111 of the semiconductor layer 110 that contacts the photo-electric conversion region and the charge storage region.

As shown in FIG. 1, a height of the semiconductor layer 110 (that is, a distance between the top surface 112 and the bottom surface 111 of the semiconductor layer 110) at a portion corresponding to the charge storage region 114 may be less than the height of the photo-electric conversion region 115. As will be described below with reference to FIG. 8D, in order to locate the shield film 140 close to the charge storage region 114, a portion of the semiconductor layer 110, including the charge storage region 114, may be etched, to form a recess. Next, the shield film 140 may be disposed on or above the bottom of the recess.

As shown in FIG. 1, the insulating film 130 may be disposed between the semiconductor layer 110 and the shield film 140. The insulating film 130 may include an insulating material and may insulate the semiconductor layer 110 from the shield film 140. According to an embodiment of the inventive concept, the shield film 140 may include a metal and may include an insulating material, for example, silicon oxide ($SiO_2$), in order to block charge transfer between the shield film 140 and the semiconductor layer 110. Also, according to an embodiment of the inventive concept, when the material layer 150 includes the insulating material, the insulating film 130 may include the same insulating material as that of the material layer 150.

The transistor layer 120 may include a transistor for controlling the photo-electric conversion region 115 and the charge storage region 114. For example, referring to FIG. 2, the unit pixel 100 may include a first transfer transistor 121 that forms a charge transfer path between the photo-electric conversion region 115 and the charge storage region 114. A gate of the first transfer transistor 121 may be formed in the transistor layer 120.

Figure 2:
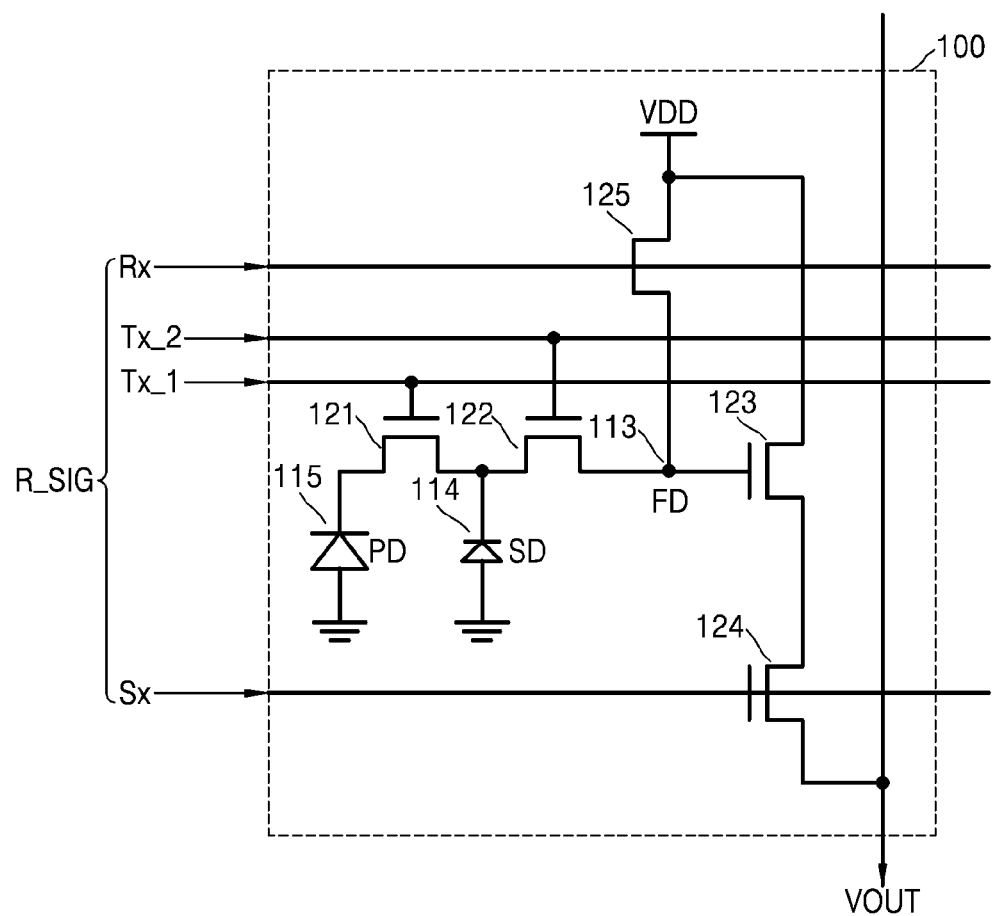
FIG. 2 is a circuit diagram illustrating the unit pixel of FIG. 1 according to an embodiment of the inventive concept.

FIG. 2 is a circuit diagram illustrating the unit pixel 100 of FIG. 1 according to an embodiment of the inventive concept. The unit pixel 100 may receive a row signal R_SIG from outside of the unit pixel 100 and may output an output voltage VOUT to the outside of the unit pixel 100. The row signal R_SIG may be applied to a gate of a transistor in order to control a plurality of transistors included in the unit pixel 100 and may include a reset signal Rx, first and second transfer signals Tx_1 and Tx_2, and a selection signal Sx. The output voltage VOUT may be determined according to an intensity of light detected by the unit pixel 100.

The unit pixel 100 may include the photo-electric conversion region 115, the charge storage region 114, the first transfer transistor 121, a second transfer transistor 122, a source-follower transistor 123, a selection transistor 124, and a reset transistor 125. Also, the unit pixel 100 may include a floating diffusion region 113 to which the second transfer transistor 122, the source-follower transfer transistor 123, and the reset transistor 125 are electrically connected.

Examples of the photo-electric conversion region 115 that absorbs light and converts the light into an electrical signal may include a photodiode, a photogate, and a phototransistor. The charge storage region 114 may temporarily store electric charges that are accumulated in the photo-electric conversion region 115. Examples of the charge storage region 114 may include a capacitor and a diode. Although the photo-electric conversion region 115 is a photodiode and the charge storage region 114 is a diode in FIG. 2, the inventive concept is not limited thereto.

The first transfer transistor 121 may pass through or block from the charge storage region 114 the electric charges that are accumulated in the photo-electric conversion region 115, according to the first transfer signal Tx_1. For example, while the photo-electric conversion region 115 absorbs the light and accumulates the electric charges, the first transfer signal Tx_1 having a voltage that may turn off the first transfer transistor 121 may be applied to the gate of the first transfer transistor 121. The second transfer transistor 122 may pass through or block from the floating diffusion region 113 the electric charges that are stored in the charge storage region 114, according to the second transfer signal Tx_2. For example, in order to output the electric charges that are stored in the charge storage region 114 to the outside of the unit pixel 100, the second transfer signal Tx_2 having a voltage that may turn on the second transfer transistor 122 may be applied to a gate of the second transfer transistor 122.

The source-follower transistor 123 may amplify a voltage of the floating diffusion region 113, and the selection transistor 124 may selectively output the amplified voltage according to the selection signal Sx. The reset transistor 125 may change a voltage of the floating diffusion region 113 to a reset voltage that is close to a power voltage, by connecting or disconnecting the floating diffusion region 113 and a power supply VDD according to the reset signal Rx. As such, the unit pixel 100, including an element that amplifies an electrical signal obtained by converting the light that is absorbed by the photo-electric conversion region 115, is referred to as an active pixel sensor (APS). The inventive concept may be applied not only to the unit pixel 100 of FIG. 2 but also to other APSs including the photo-electric conversion region 115 and the charge storage region 114.

Figure 3:
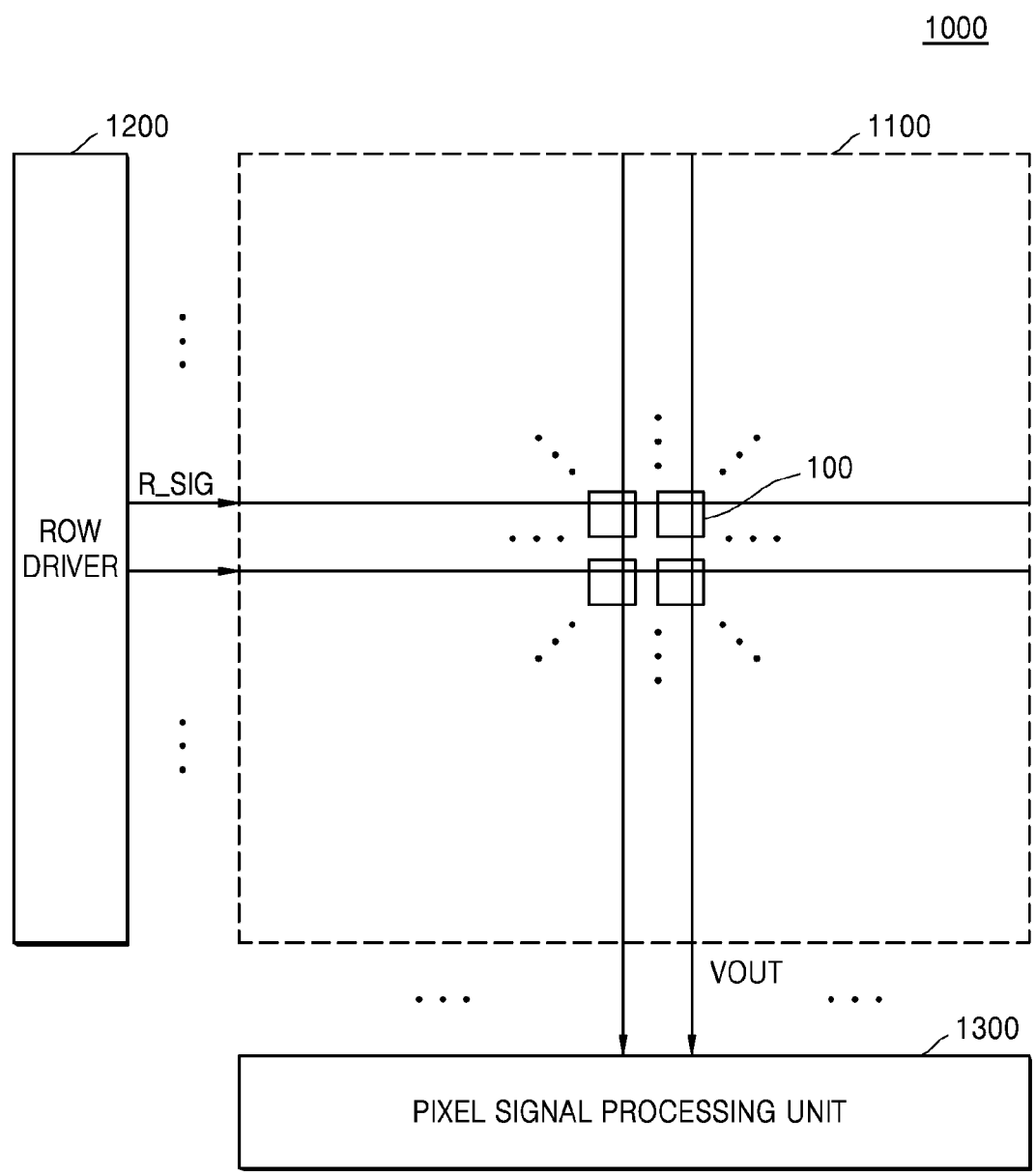
FIG. 3 is a schematic view illustrating an image sensor including the unit pixel of FIG. 2, according to an embodiment of the inventive concept.

FIG. 3 is a schematic view illustrating an image sensor 1000 including the unit pixel 100 of FIG. 2, according to an embodiment of the inventive concept. The image sensor 1000 may include a pixel array 1100, a row driver 1200, and a pixel signal processing unit 1300. The pixel array 1100 may include a plurality of unit pixels 100 that are laterally and uniformly arranged. The row driver 1200 may output a row signal R_SIG, and the row signal R_SIG may be input to the pixel array 1100. As described with reference to FIG. 2, the row signal R_SIG may include a plurality of signals, and the plurality of signals may control each of the plurality of unit pixels 100 of the pixel array 1100.

The pixel signal processing unit 1300 may receive an output voltage VOUT that is output from at least one unit pixel 100 of the pixel array 1100 and may measure a magnitude of the output voltage VOUT. The plurality of unit pixels 100 that constitute rows may share the same row signal R_SIG, and the plurality of unit pixels 100 that constitute columns may share a signal line through which each output voltage VOUT is output. Since the number of the plurality of unit pixels 100 of the pixel array 1100 is tens of thousands or more, the pixel signal processing unit 1300 may not simultaneously measure the output voltages VOUT that are output from all of the unit pixels 100 of the pixel array 1100. Accordingly, the pixel signal processing unit 1300 may measure the output voltage VOUT that is output from a portion of the plurality of unit pixels 100 of the pixel array 1100, and then may measure the output voltage VOUT that is output from the remaining unit pixels 100. For example, the pixel signal processing unit 1300 may simultaneously measure the output voltage VOUT that is output from the unit pixels 100 that belong to one row in the pixel array 1100.

Considering such characteristics of the pixel signal processing unit 1300, a rolling shutter method that is performed under control of the row driver 1200 involves starting exposures of the unit pixels 100 that constitute different rows to the light at different times, and also ending the exposures of the unit pixels 100 that constitute the different rows to the light at different times. That is, the rolling shutter method is characterized in that since lengths of the exposures of the unit pixels 100 of the pixel array 1100 to the light have to be the same, by using a difference in times at which the exposures of the unit pixels 100 that constitute the different rows to the light end, as soon as an exposure of the unit pixels 100 that constitute each row to the light ends, the output voltage VOUT that is output from the unit pixels 100 that constitute the row is measured. However, since there is a difference in times at which the plurality of unit pixels 100 included in the pixel array 1100 are exposed to the light, when a moving image is detected, a rolling shutter may produce distortions.

In contrast, a global shutter method that may be performed under the control of the row driver 1200 involves starting the exposures of the unit pixels 100 included in the pixel array 1100 to the light at the same time, and also ending the exposures of the unit pixels 100 included in the pixel array 1100 to the light at the same time. In addition, the global shutter method involves enabling the pixel signal processing unit 1300 to measure the output voltages VOUT that are output from the unit pixels 100 at different times. A global shutter may not produce the distortions even when the moving image is detected, unlike the rolling shutter, because times at which all of the unit pixels 100 of the pixel array 1100 are exposed to the light are the same. Accordingly, until the exposures of the unit pixels 100 to light end and then the output voltages VOUT that are output from the unit pixels 100 are measured by the pixel signal processing unit 1300, the electric charges that are accumulated in the photo-electric conversion region 115 included in the unit pixel 100 may be stored. In the embodiments of FIGS. 1 and 2, the charge storage region 114 may temporarily store the electric charges that are accumulated in the photo-electric conversion region 115 until the output voltages VOUT according to the accumulated electric charges are measured by the pixel signal processing unit 1300.

Figure 4A:
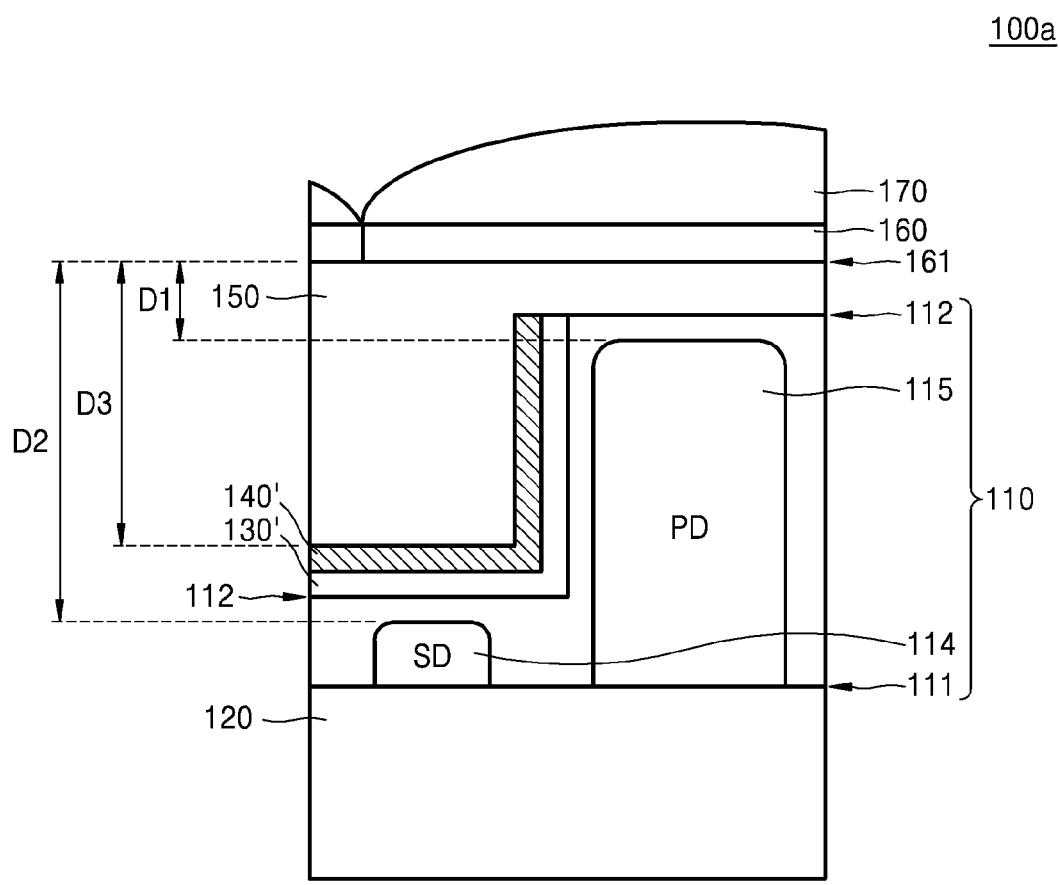
FIGS. 4A and 4B are cross-sectional views illustrating unit pixels included in an image sensor, according to embodiments of the inventive concept.
Figure 4B:
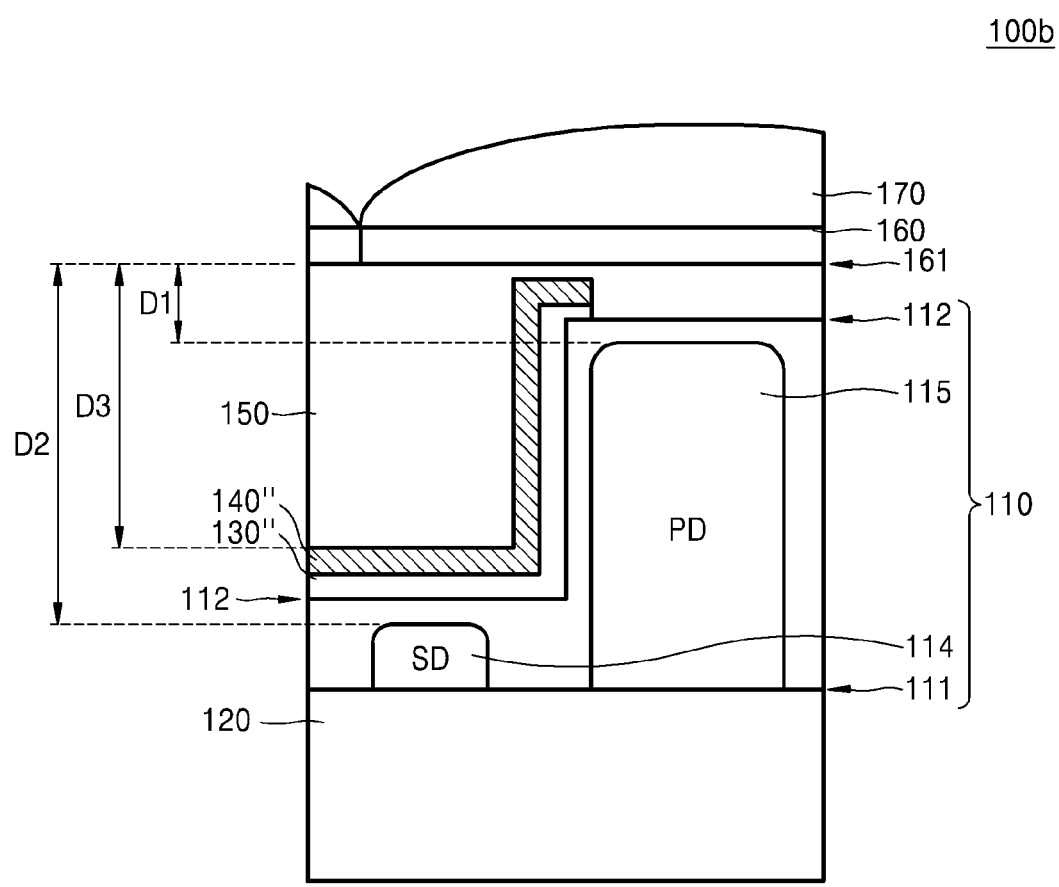

FIGS. 4A and 4B are cross-sectional views illustrating unit pixels 100a and 100b included in an image sensor, according to embodiments of the inventive concept. As shown in FIGS. 4A and 4B, the unit pixel 100a or 100b may include the semiconductor layer 110, the transistor layer 120, an insulating film 130' or 130", a shield film 140' or 140", the material layer 150, the color filter layer 160, and the lens layer 170. The semiconductor layer 110 may have the bottom surface 111 and the top surface 112 that face each other, and the transistor layer 120 may be formed on the bottom surface 111 of the semiconductor layer 110. Also, the material layer 150, the color filter layer 160, and the lens layer 170 may be formed by being sequentially stacked on the top surface 112 of the semiconductor layer 110. The semiconductor layer 110, the transistor layer 120, the material layer 150, the color filter layer 160, and the lens layer 170 have already been explained with reference to FIG. 1, and thus a detailed explanation thereof will not be given.

FIG. 4A is a cross-sectional view illustrating the unit pixel 100a including the shield film 140', according to another embodiment of the inventive concept. According to embodiments of the inventive concept, the shield film 140' that is disposed between the color filter layer 160 and the charge storage region 114 may extend toward the color filter layer 160 along an outer surface (for example, a side surface) of the photo-electric conversion region 115. As shown in FIG. 4A, the shield film 140' may be disposed between the color filter layer 160 and the charge storage region 114, and may be spaced apart from the bottom surface 161 of the color filter layer 160 by the third distance D3 that is greater than the first distance D1 between the bottom surface 161 of the color filter layer 160 and the photo-electric conversion region 115 and is less than the second distance D2 between the bottom surface 161 of the color filter layer 160 and the charge storage region 114. As the shield film 140' extends toward the color filter layer 160 along the outer surface (for example, the side surface) of the photo-electric conversion region 115, the insulating film 130' may also extend toward the color filter layer 160 along the outer surface (for example, the side surface) of the photo-electric conversion region 115 between the semiconductor layer 110 and the shield film 140'.

FIG. 4B is a cross-sectional view illustrating the unit pixel 100b including the shield film 140", according to another embodiment of the inventive concept. Referring to FIG. 4B, the shield film 140" may extend along a top surface of the photo-electric conversion region 115. As shown in FIG. 4B, the shield film 140" that extends toward the color filter layer 160 along the side surface of the photo-electric conversion region 115 may further extend along the top surface of the photo-electric conversion region 115. An area of the shield film 140" that extends along the top surface of the photo-electric conversion region 115 may be determined according to the amount of light that is incident on the photo-electric conversion region 115, or may be determined during a process of forming the shield film 140" and/or the insulating film 130" in a process of manufacturing the image sensor.

Figure 5:
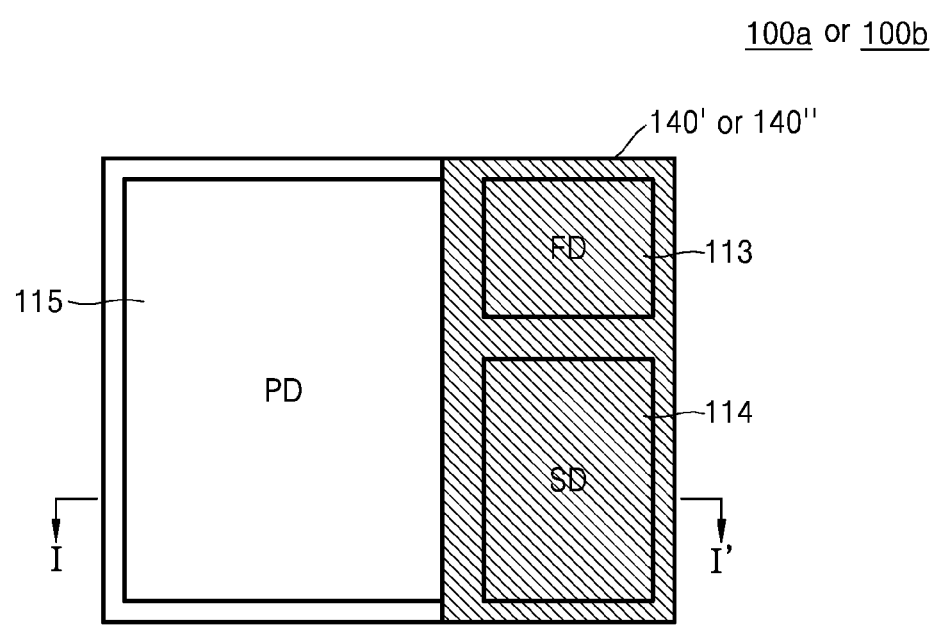
FIG. 5 is a top view illustrating a unit pixel included in an image sensor, according to an embodiment of the inventive concept.

FIG. 5 is a top view illustrating a unit pixel included in an image sensor, according to an embodiment of the inventive concept. For example, FIG. 5 is a top view of the unit pixel 100a or 100b of FIG. 4A or 4B, seen in a direction in which light is incident. As described with reference to FIG. 2, the unit pixel 100a or 100b may include the floating diffusion region 113 in addition to the photo-electric conversion region 115 and the charge storage region 114. According to embodiments of the inventive concept, the shield film 140' or 140" may extend to be disposed over a top surface of the floating diffusion region 113. That is, as shown in FIG. 5, seen in the direction in which the light is incident, the shield film 140' or 140" may cover the charge storage region 114 and the floating diffusion region 113 but not the photo-electric conversion region 115. Although the charge storage region 114 and the floating diffusion region 113 are shown in FIG. 5 for an easier explanation, the charge storage region 114 and the floating diffusion region 113 may not be shown due to the shield film 140' or 140" including a material that blocks the light. FIG. 4A or 4B illustrates the unit pixel 100a or 100b taken along line I-I' of FIG. 5.

Figure 6A:
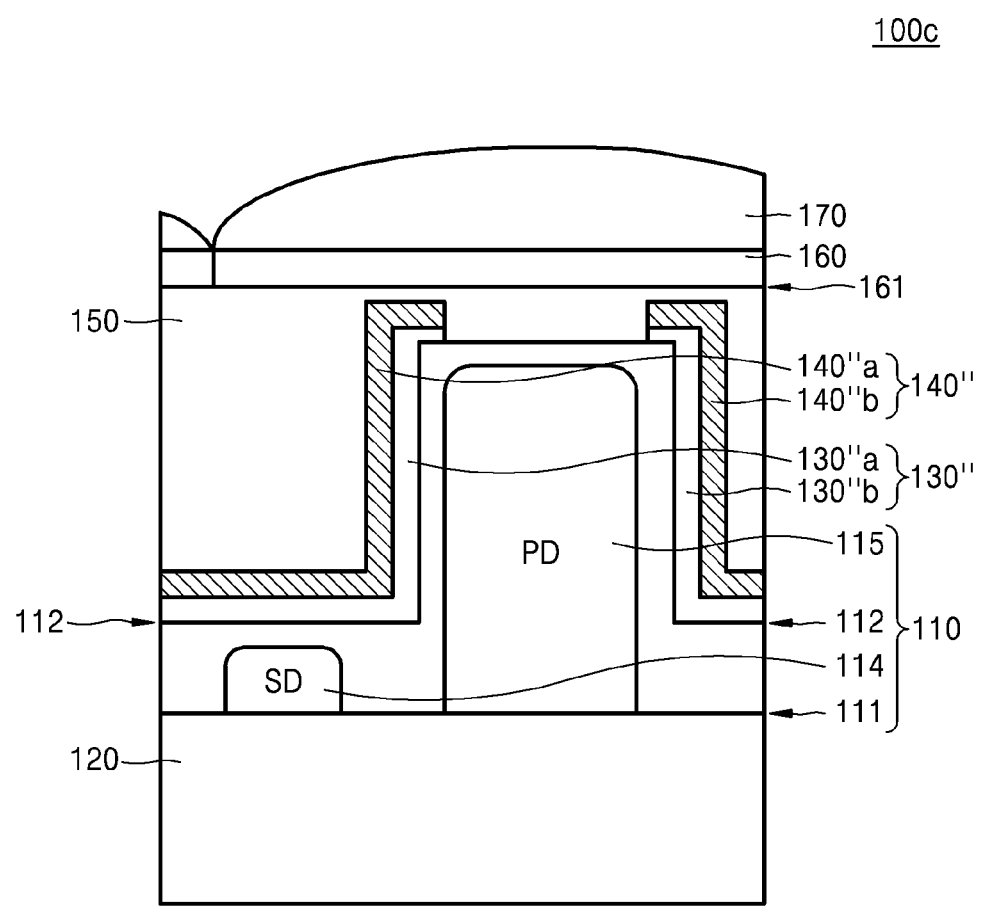
FIGS. 6A and 6B are cross-sectional views illustrating unit pixels included in an image sensor, according to embodiments of the inventive concept.
Figure 6B:
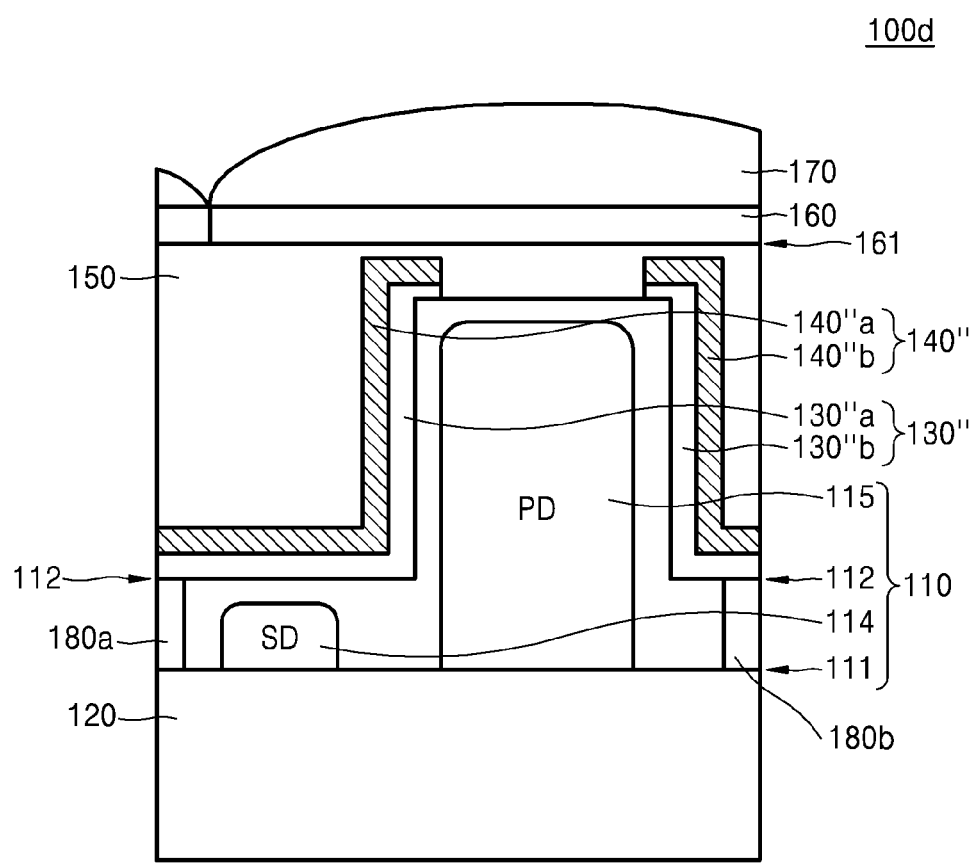

FIGS. 6A and 6B are cross-sectional views illustrating unit pixels 100c and 100d included in an image sensor, according to embodiments of the inventive concept. As shown in FIGS. 6A and 6B, the unit pixel 100c or 100d may include the semiconductor layer 110, the transistor layer 120, the insulating film 130", the shield film 140", the material layer 150, the color filter layer 160, and the lens layer 170. The semiconductor layer 110 may have the bottom surface 111 and the top surface 112 that face each other, and the transistor layer 120 may be formed on the bottom surface 111 of the semiconductor layer 110. Also, the material layer 150, the color filter layer 160, and the lens layer 170 may be formed by being sequentially stacked on the top surface 112 of the semiconductor layer 110. The semiconductor layer 110, the transistor layer 120, the material layer 150, the color filter layer 160, and the lens layer 170 have already been explained with reference to FIG. 1, and thus a detailed explanation thereof will not be given.

FIG. 6A is a cross-sectional view illustrating the unit pixel 100c including the shield film 140", according to another embodiment of the inventive concept. According to embodiments of the inventive concept, the shield film 140" may cover a remaining portion other than a portion of the top surface 112 of the semiconductor layer 110 corresponding to a top surface of the photo-electric conversion region 115. That is, the shield film 140" may include an opening through which light incident on the photo-electric conversion region 115 passes, and the opening of the shield film 140" may be formed between the color filter layer 160 and the photo-electric conversion region 115. A size of the opening of the shield film 140" may be determined according to the amount of the light that is incident on the photo-electric conversion region 115, or may be determined during a process of forming the shield film 140" and/or the insulating film 130" in a process of manufacturing the image sensor. As shown in FIG. 6A, a shield film 140"a may be disposed between the color filter layer 160 and the charge storage region 114, and may extend along a side surface of the photo-electric conversion region 115. Also, a shield film 140"b may be disposed between the color filter layer 160 and the charge storage region 114 of another unit pixel (not shown) that is disposed beside (on the right side of) the unit pixel 100c, and may extend along the side surface of the photo-electric conversion region 115 of the unit pixel 100c. Referring to FIG. 3, the pixel array 1100 may include a plurality of unit pixels 100c, and a remaining portion other than a portion corresponding to the top surface of the photo-electric conversion region 115 may be covered by the shield film 140" in FIG. 6A.

FIG. 6B is a cross-sectional view illustrating the unit pixel 100d including the shield film 140" and trenches 180a and 180b, according to another embodiment of the inventive concept. According to embodiments of the inventive concept, the unit pixel 100d may include the trenches 180a and 180b. The trenches 180a and 180b may be formed by using a trench isolation method. The trench isolation method may be classified into a shallow trench isolation (STI) method and a deep trench isolation (DTI) method according to a depth of a trench. An isolation film of an STI or DTI structure does not generate a bird's beak, compared to that of a local oxidation of silicon (LOCOS) structure. Thus, an active region of a substrate may not be removed and may be maintained. According to the embodiments of the inventive concept, the trenches 180a and 180b may be STI trenches that extend from the bottom surface 111 of the semiconductor layer 110 toward the top surface 112 of the semiconductor layer 110.

The trenches 180a and 180b may ensure an independent operation of the unit pixel 100d by blocking charge transfer between the unit pixel 100d and unit pixels adjacent to the unit pixel 100d. For example, electric charges that are retained in the charge storage region 114 and the photo-electric conversion region 115 of the unit pixel 100d may not leak to the unit pixels adjacent to the unit pixel 100d due to the trenches 180a and 180b. Also, electric charges of the unit pixels adjacent to the unit pixel 100d may not be introduced into the charge storage region 114 and the photo-electric conversion region 115 of the unit pixel 100d. As will be described below with reference to FIG. 8D, a portion of the semiconductor layer 110 that corresponds to the charge storage region 114 may be etched, and the trenches 180a and 180b may also be etched. Accordingly, as shown in FIG. 6B, bottom surfaces of the trenches 180a and 180b may be etched, and side walls of the trenches 180a and 180b may remain.

Figure 7A:
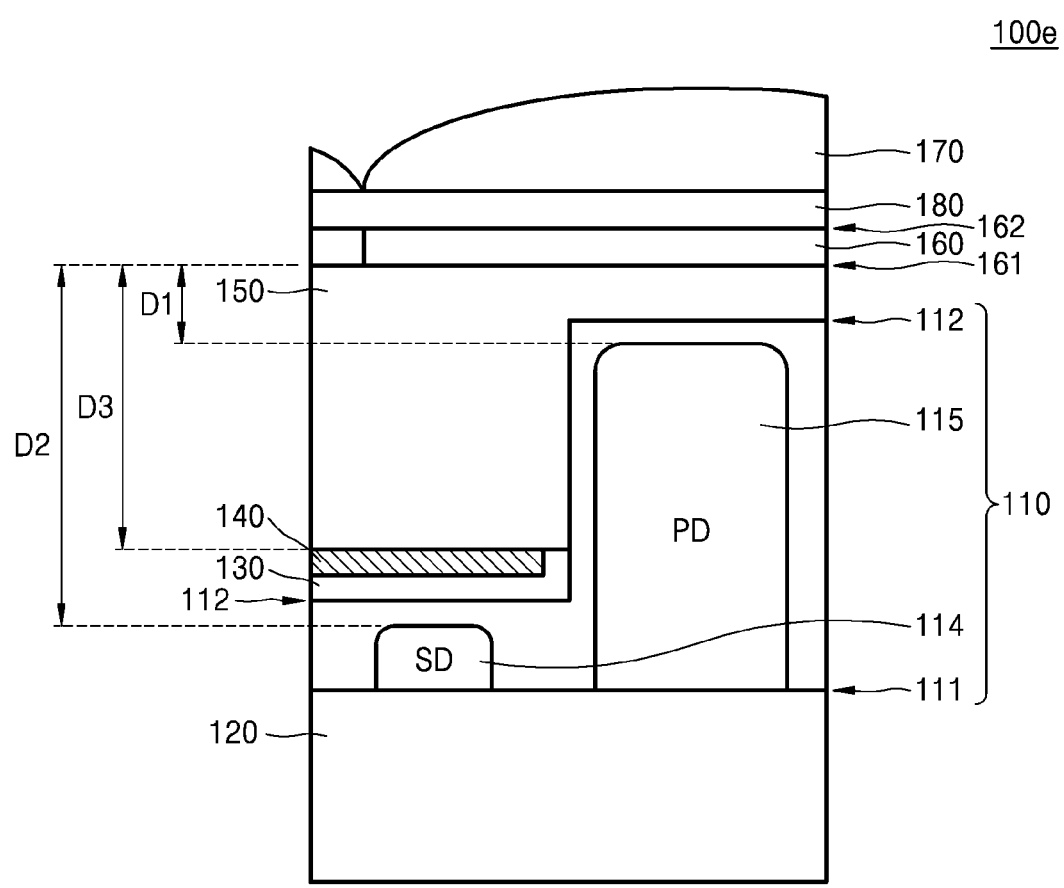
FIGS. 7A and 7B are views illustrating a unit pixel included in an image sensor, according to an embodiment of the inventive concept.
Figure 7B:
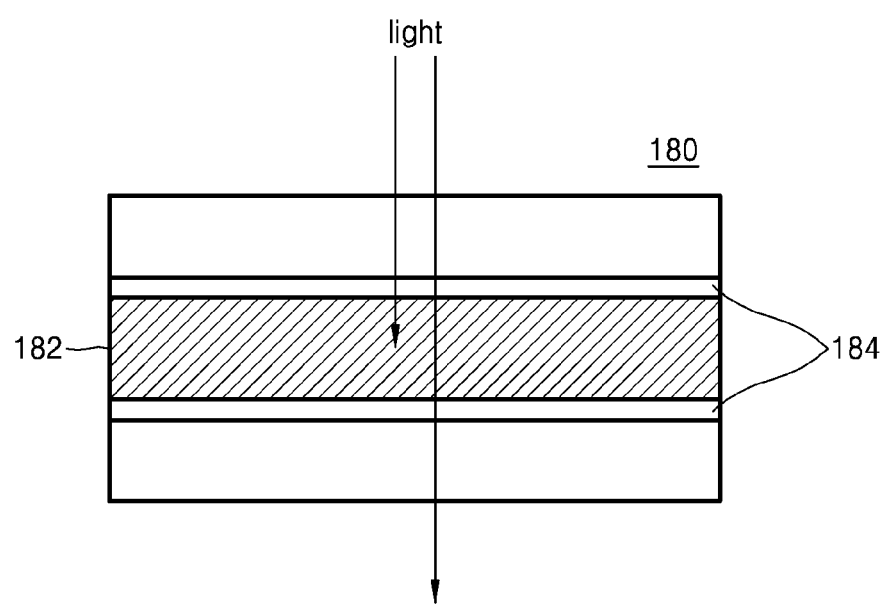

FIGS. 7A and 7B are cross-sectional views illustrating an image sensor including an organic photoelectric conversion layer, according to an embodiment of the inventive concept.

The image sensor including the organic photoelectric conversion layer may be referred to as an organic image sensor, and a unit pixel included in the organic image sensor may include one or more organic photoelectric conversion layers that are stacked in a direction in which light is incident, for example, organic photoelectric conversion layers corresponding to one or more of a blue wavelength, a green wavelength and a red wavelength.

FIG. 7A is a cross-sectional view illustrating a unit pixel 100e including an organic photoelectric conversion layer 180, according to an embodiment of the inventive concept. As shown in FIG. 7A, the unit pixel 100e may include the semiconductor layer 110, the transistor layer 120, the insulating film 130, the shield film 140, the material layer 150, the color filter layer 160, and the lens layer 170. The semiconductor layer 110 may have the bottom surface 111 and the top surface 112 that face each other, and the transistor layer 120 may be formed on the bottom surface 111 of the semiconductor layer 110. Also, the material layer 150, the color filter layer 160, and the lens layer 170 may be formed by being sequentially stacked on the top surface 112 of the semiconductor layer 110. The semiconductor layer 110, the transistor layer 120, the material layer 150, the color filter layer 160, and the lens layer 170 have already been explained with reference to FIG. 1, and thus a detailed explanation thereof will not be given.

According to embodiments of the inventive concept, the organic photoelectric conversion layer 180 may be disposed on the top surface 162 of the color filter layer 160 to be located between the color filter layer 160 and the lens layer 170. According to the embodiments of the inventive concept, the unit pixel 100e may detect intensities of light having wavelengths corresponding to at least two colors among blue, red, and green by using the organic photoelectric conversion layer 180 and the photo-electric conversion region 115. For example, the organic photoelectric conversion layer 180 may output electric charges according to an intensity of light having a blue wavelength in response to the light having the blue wavelength, and the color filter layer 160 may pass light having a red wavelength through the photo-electric conversion region 115. Accordingly, the unit pixel 100e may detect the intensities of the light corresponding to the blue wavelength and the red wavelength.

FIG. 7B is a cross-sectional view illustrating a structure of the organic photoelectric conversion layer 180 according to an embodiment of the inventive concept. As shown in FIG. 7B, the organic photoelectric conversion layer 180 may include a reaction layer 182 that is sensitive to a blue wavelength, a green wavelength, or a red wavelength. Also, charge accumulation films 184 that are formed on both surfaces of the reaction layer 182 may accumulate electric charges that are generated when the reaction layer 182 absorbs light. Referring to FIGS. 7A and 7B, the accumulated electric charges may be moved to the transistor layer 120 on which transistors are formed through conductors connected to the charge accumulation films 184. Although only one reaction layer 182 is illustrated in FIG. 7B, the inventive concept is not limited thereto and reaction layers that are sensitive to two or more different wavelengths may be stacked and charge accumulation films may be formed on both surfaces of each of the reaction layers.

FIGS. 8A through 8F are cross-sectional views explaining a method of manufacturing an image sensor including the unit pixel 100a of FIG. 4A, according to an embodiment of the inventive concept. In order to explain the method of manufacturing the image sensor, two adjacent unit pixels are illustrated in FIGS. 8A through 8F. Referring to FIG. 4A, the unit pixel 100a may include the semiconductor layer 110, the transistor layer 120, the material layer 150, the color filter layer 160, and the lens layer 170. According to embodiments of the inventive concept, the unit pixel 100a may include the shield film 140' that blocks light incident on the charge storage region 114 between the semiconductor layer 110 and the material layer 150, and the insulating film 130' that insulates the charge film 140' from the semiconductor layer 110. The shield film 140' may be disposed between the color filter layer 160 and the charge storage region 114, and may be spaced apart from the bottom surface 161 of the color filter layer 160 by the third distance D3. The third distance D3 is greater than the first distance D1 between the bottom surface 161 of the color filter layer 160 and the photo-electric conversion region 115, and the third distance D3 is less than the second distance D2 between the bottom surface 161 of the color filter layer 160 and the charge storage region 114.

Figure 8A:
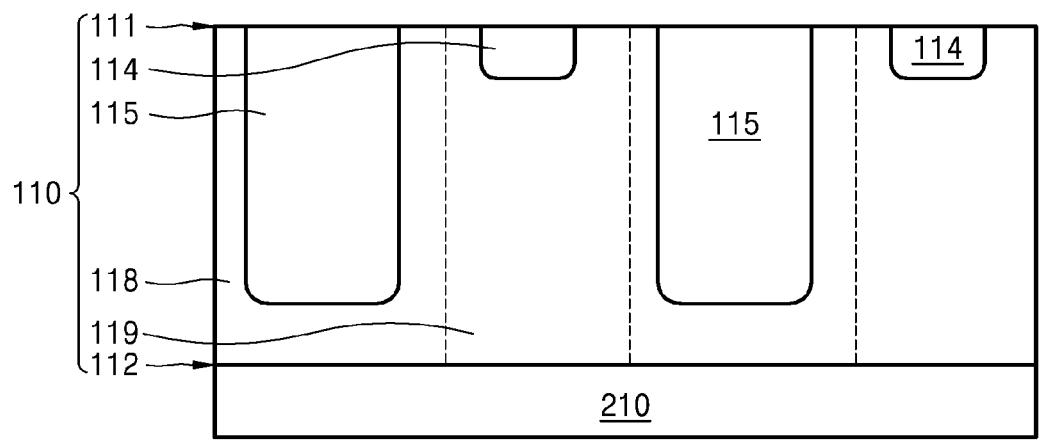
FIGS. 8A, 8B, 8C, 8D, 8E and 8F are cross-sectional views explaining a method of manufacturing an image sensor including the unit pixel of FIG. 4A, according to an embodiment of the inventive concept.

According to embodiments of the inventive concept, referring to FIG. 8A, the semiconductor layer 110 may be formed on a first support substrate 210. The semiconductor layer 110 may be formed from any one of a bulk substrate, an epitaxial substrate, and an SOI substrate. A contact surface between the first support substrate 210 and the semiconductor layer 110 is referred to as the top surface 112 or the rear surface of the semiconductor layer 110, and a surface of the semiconductor layer 110 that faces the top surface 112 of the semiconductor layer 110 is referred to as the bottom surface 111 or the front surface. According to embodiments of the inventive concept, the image sensor may be a backside illumination (BSI) sensor. The semiconductor layer 110 may be overturned in a manufacturing process, and thus names of the top surface 112 and the bottom surface 111 of the semiconductor layer 110 may be derived. The photo-electric conversion region 115 and the charge storage region 114 may be formed by introducing (for example, diffusing or injecting) impurities through the bottom surface 111 of the semiconductor layer 110. The photo-electric conversion region 115 and the charge storage region 114 may contact the top surface 112 of the semiconductor layer 110. As shown in FIG. 8A, the semiconductor layer 110 may include a first area 118 that includes the photo-electric conversion region 115 and a second area 119 that includes the charge storage region 114.

Figure 8B:
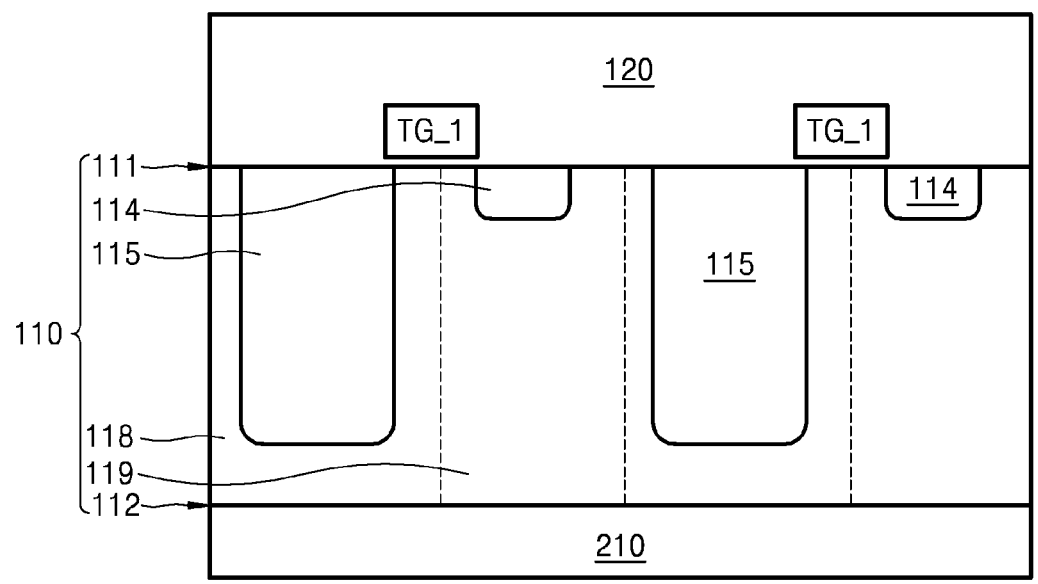

Referring to FIG. 8B, the transistor layer 120 may be formed on the bottom surface 111 of the semiconductor layer 110. The transistor layer 120 may include a gate TG_1 of the first transfer transistor 121 that is formed on the bottom surface 111 of the semiconductor layer 110. The first transfer transistor 121 may transmit electric charges between the photo-electric conversion region 115 and the charge storage region 114. Although only the gate TG_1 of the first transfer transistor 121 is illustrated in FIG. 8B, not only a gate of the second transfer transistor 122 of FIG. 2 but also active devices, for example, transistors, for transmitting or processing an electrical signal according to the electric charges that are accumulated in the photo-electric conversion region 115 may be formed in the transistor layer 120. Although not shown in FIG. 8B, a wiring layer (not shown) may be formed on the transistor layer 120. The wiring layer may have a structure in which a wiring and an interlayer insulating film are stacked and may be formed by using evaporation and etching. The wiring may be formed of a conductive material, for example, a metal or an alloy film that is formed by combining at least two metals. The interlayer insulating film may be formed of an insulating material, for example, silicon oxide. A multi-layer wiring may be formed by repeatedly forming the wiring and the interlayer insulating film.

Figure 8C:
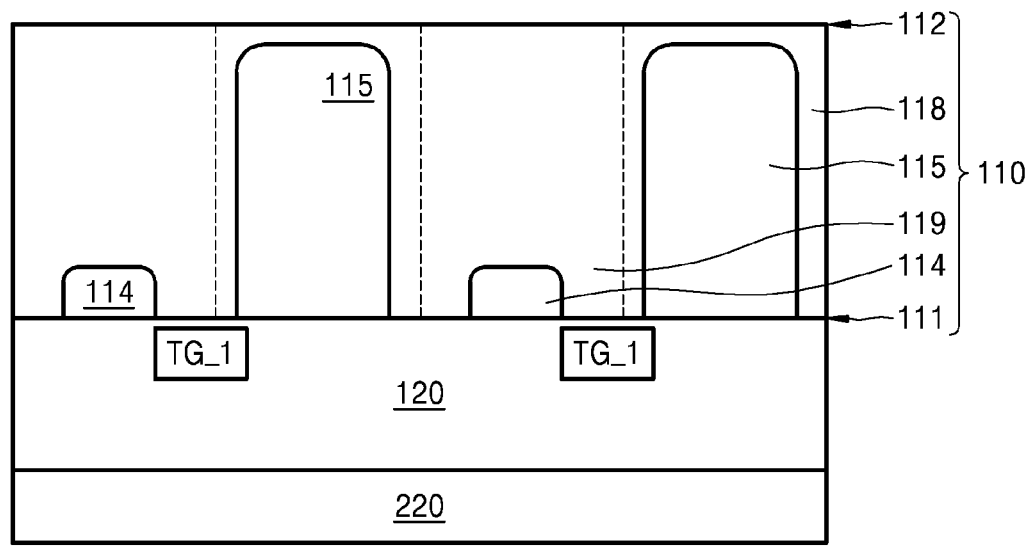

Referring to FIGS. 8B and 8C, a second support substrate 220 may support one surface of the transistor layer 120, and may be adhered to the transistor layer 120 (or to the wiring layer when the wiring layer is formed on the transistor layer 120). Next, a multi-layer structure including the first support substrate 210 and the second support substrate 220 may be overturned (that is, vertically turned over) such that the first support substrate 210 may be disposed over the second support substrate 220. The first support substrate 210 may be removed. For example, the first support substrate 210 may be cut by using a grinder by tens of μm, and a remaining portion may be removed by using etching.

Figure 8D:
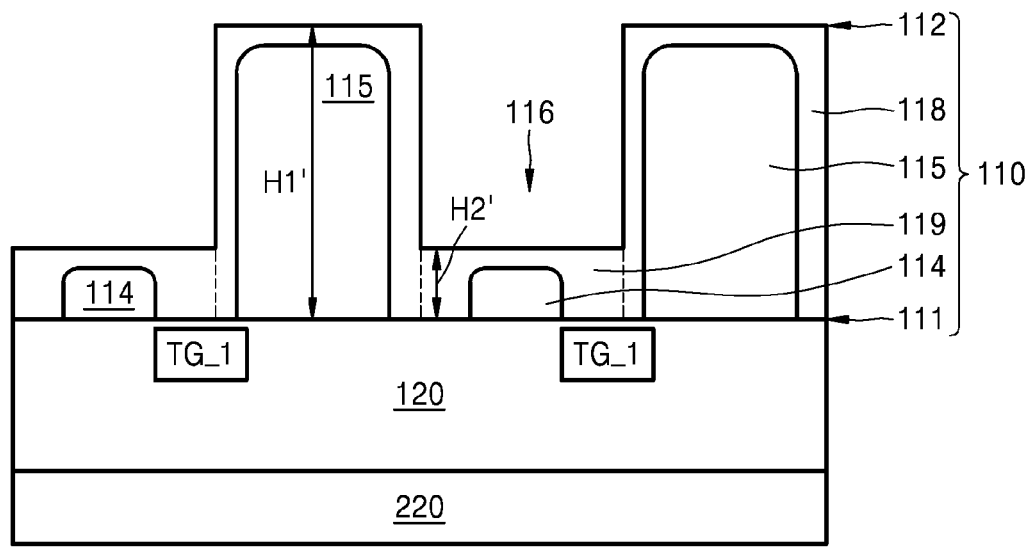

Referring to FIG. 8D, after the first support substrate 210 is removed, the top surface 112 of the semiconductor layer 110 that is exposed again to the outside may be selectively etched. That is, as shown in FIG. 8D, a recess 116 may be formed by etching an upper portion of the second area 119 of the semiconductor layer 110 including the charge storage region 114. That is, in FIG. 8C, a portion of the semiconductor layer 110 that corresponds to a portion between the rear surface 112 of the semiconductor layer 110 and the charge storage region 114 may be etched and removed. Accordingly, the semiconductor layer 110 may include the first area 118 and the second area 119 having a height H2' that is less than a height H1' of the first area 118. According to an embodiment of the inventive concept, the second area 119 may further include an element other than the photoelectric conversion region 115, for example, the floating diffusion region 113. An upper portion of the floating diffusion region 113 may also be etched as the upper portion of the second area 119 is etched, and thus a remaining portion other than the first area 118 including the photoelectric conversion region 115 may be etched. That is, referring to FIGS. 8C and 5, a portion of the semiconductor layer 110 that corresponds to a portion between the rear surface 112 of the semiconductor layer 110 and the floating diffusion region 113 may be additionally etched and removed. The second area 119 of the semiconductor layer 110 may be etched by using various etching methods, for example, wet etching or dry etching. A height of the charge storage region 114, that is, a distance between the bottom surface 111 of the semiconductor layer 110 and a top surface of the charge storage region 114, may be determined according to an etching depth (that is, a depth of the recess 116).

Figure 8E:
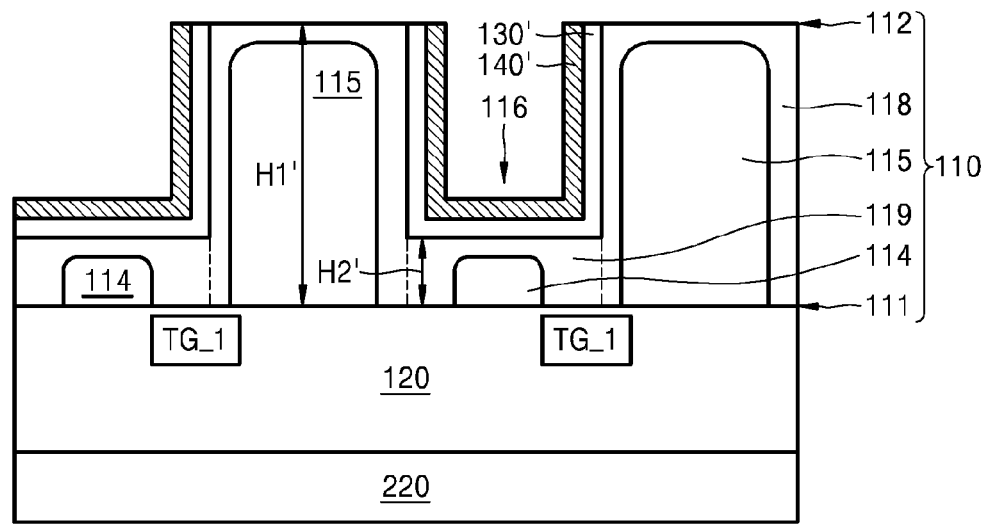

Referring to FIGS. 8D and 8E, the insulating film 130' may be formed on a top surface of the second area 119 of the semiconductor layer 110, and the shield film 140' may be formed on the insulating film 130'. That is, the insulating film 130' may be formed on a bottom surface of the recess 116 of the semiconductor layer 110, and the shield film 140' may be formed on the insulating film 130'. The insulating film 130' may include an insulating material and may insulate the shield film 140' from the semiconductor layer 110. As shown in FIGS. 4A and 8E, the insulating film 130' and the shield film 140' may extend along a side surface (that is, a side wall of the recess 116) of the first area 118. Also, as shown in FIG. 4B, the insulating film 130' and the shield film 140' may extend to be disposed over a part of a top surface of the first area 118. The insulating film 130' and the shield film 140' may be formed by using deposition or evaporation.

Figure 8F:
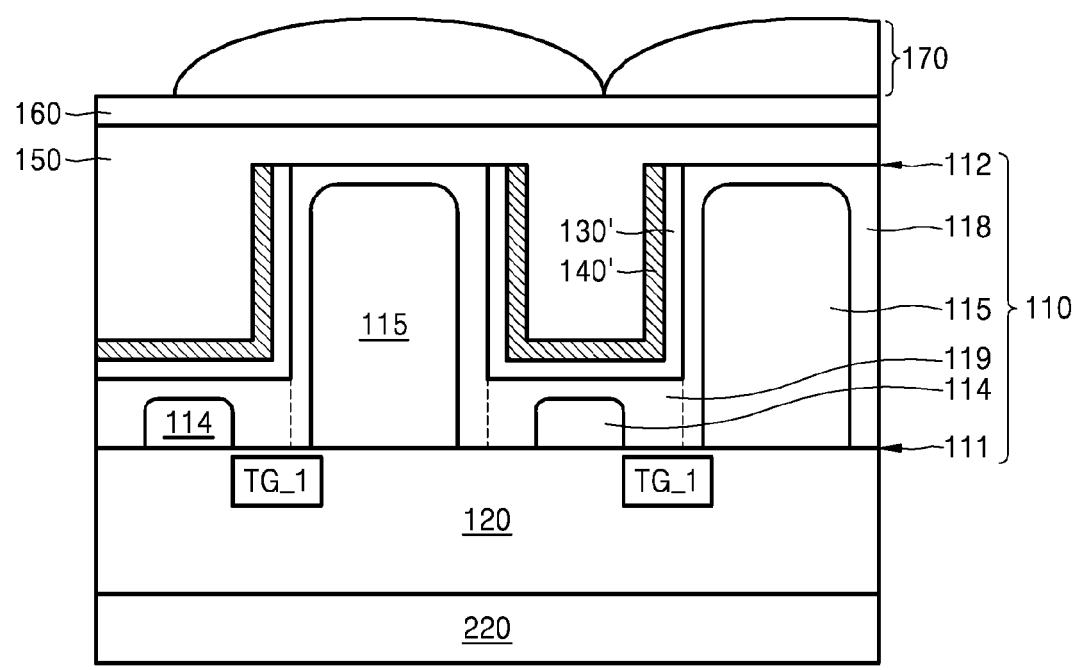

Referring to FIG. 8F, the material layer 150 may be formed on the semiconductor layer 110, the insulating film 130', and the shield film 140'. Next, the color filter layer 160 and the lens layer 170 may be formed on the material layer 150. A planarization layer may be formed after the color filter layer 160 is formed and before the lens layer 170 is formed. The planarization layer may be formed of a material having a high light transmittance such as a polyamide-based material or an acryl-based material. After the lens layer 170 is formed, a residual material on a surface of the lens layer 170 may be removed. Also, a baking process may be performed in order to maintain a shape of the lens layer 170. According to an embodiment of the inventive concept, referring to FIG. 7B, the organic photoelectric conversion layer 180 may be formed over the material layer 150 after the color filter layer 160 is formed.

Figure 9:
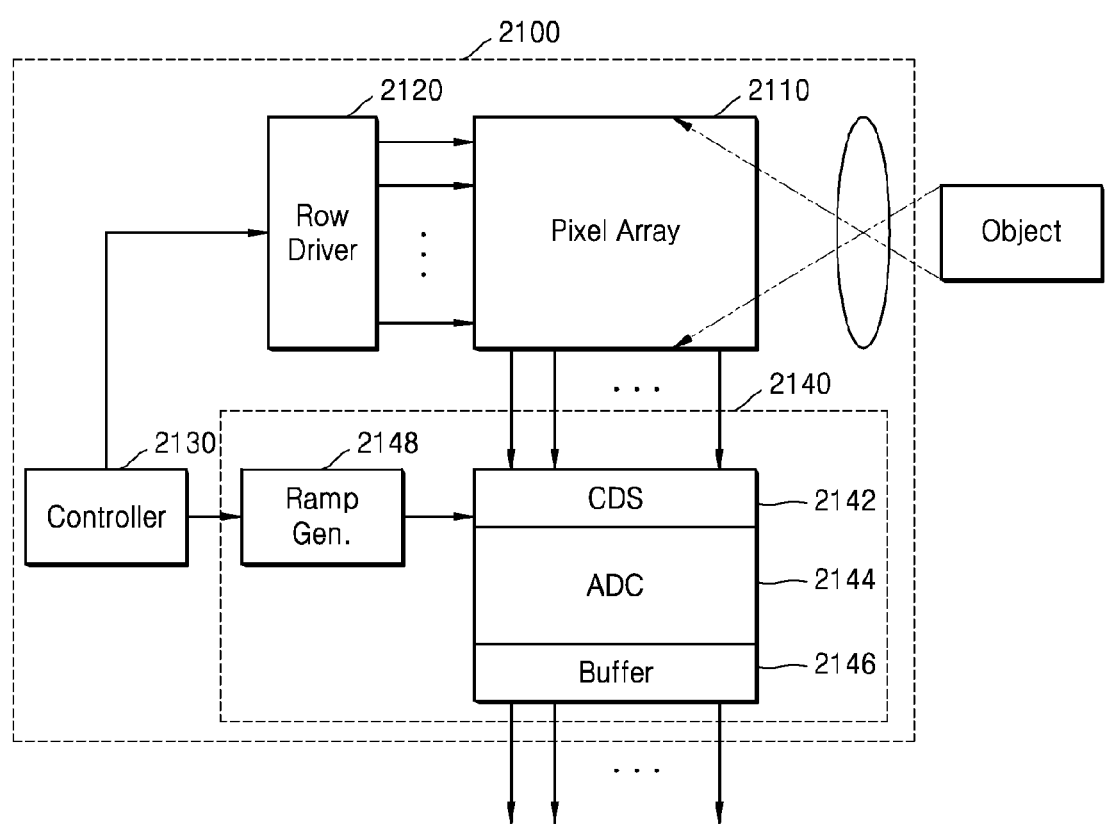
FIG. 9 is a block diagram of elements of an image sensor according to an embodiment of the inventive concept.

FIG. 9 is a block diagram of elements of an image sensor 2100 according to an embodiment of the inventive concept. As shown in FIG. 9, the image sensor 2100 may include a pixel array 2110, a controller 2130, a row driver 2120, and a pixel signal processing unit 2140. The pixel array 2110 may include the unit pixel 100 according to one of the embodiments of the inventive concept. That is, the charge storage region 114 included in the unit pixel 100 may temporarily store electric charges accumulated in the photoelectric conversion region 115 in a condition that light is blocked by the shield film 140. The charge storage region 114 may transmit the temporarily stored electric charges to the floating diffusion region 113.

The pixel array 2110 may include a plurality of unit pixels that are two-dimensionally arranged, and each of the plurality of unit pixels may include a photo-electric conversion region. The photo-electric conversion region may generate the electric charges by absorbing the light, and an electrical signal (an output voltage) according to the generated electric charges may be applied to the pixel signal processing unit 2140 through vertical signal lines. The plurality of unit pixels included in the pixel array 2110 may apply one output voltage at a time for each row, and thus unit pixels that belong to one row of the pixel array 2110 may be simultaneously activated by a selection signal that is output from the row driver 2120. The unit pixels that belong to the selected row may be provided to an output line of a column corresponding to the output voltage according to the absorbed light.

The controller 2130 may control the row driver 2120 so that the pixel array 2110 can absorb the light, accumulate the electric charges, temporarily store the accumulated electric charges, or output an electrical signal according to the stored electric charges to the outside of the pixel array 2110. Also, the controller 2130 may control the pixel signal processing unit 2140 to measure the output voltage that is applied by the pixel array 2110.

The pixel signal processing unit 2140 may include a correlated double sampler (CDS) 2142, an analog-to-digital converter (ADC) 2144, and a buffer 2146. The CDS 2142 may sample and hold the output voltage provided by the pixel array 2110. The CDS 2142 may sample a level of specific noise and a level of the generated output voltage, and may output a level corresponding to a difference between the level of the specific noise and the level of the generated output voltage. Also, the CDS 2142 may receive a ramp signal generated by a ramp signal generator 2148, may compare the ramp signal with the level corresponding to a difference between the level of the specific noise and the level of the generated output voltage, and may output a comparison result.

The ADC 2144 may convert an analog signal that corresponds to the level received from the CDS 2142 into a digital signal. The buffer 2146 may latch the digital signal. The latched digital signal may be sequentially output to the outside of the image sensor 2100 and may be transmitted to an image processor (not shown).

Figure 10:
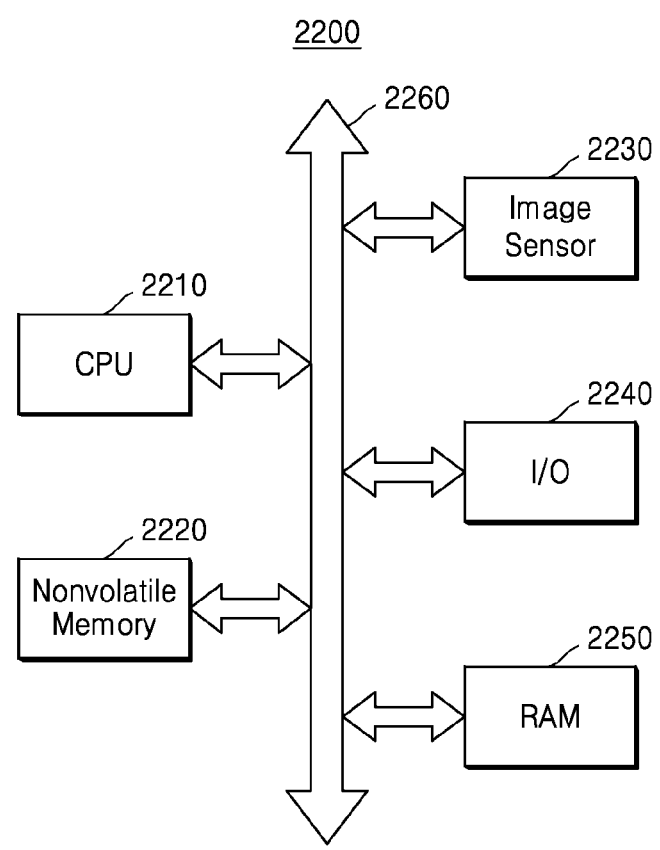
FIG. 10 is a block diagram of a system including an image sensor, according to an embodiment of the inventive concept.

FIG. 10 is a block diagram of a system 2200 including an image sensor 2230, according to an embodiment of the inventive concept. The system 2200 may be any one of a computing system, a camera system, a scanner, a vehicle navigation system, a video phone, a security system, and a movement detection system which require image data.

As shown in FIG. 10, the system 2200 may include a central processing unit (CPU) (or a processor) 2210, a non-volatile memory 2220, the image sensor 2230, an input/output (I/O) device 2240, and random-access memory (RAM) 2250. The CPU 2210 may communicate with the non-volatile memory 2220, the image sensor 2230, the I/O device 2240, and the RAM 2250 via a bus 2260. The image sensor 2230 may be embodied as an independent semiconductor chip, or may be combined with the CPU 2210 into one semiconductor chip. The image sensor 2230 included in the system 2200 of FIG. 10 may include the unit pixel 100 according to one of the embodiments of the inventive concept. That is, the charge storage region 114 included in the unit pixel 100 may temporarily store electric charges that are accumulated in the photo-electric conversion region 115 in a condition that light is blocked by the shield film 140. The charge storage region 114 may transmit the temporarily stored electric charges to the floating diffusion region 113.

Figure 11:
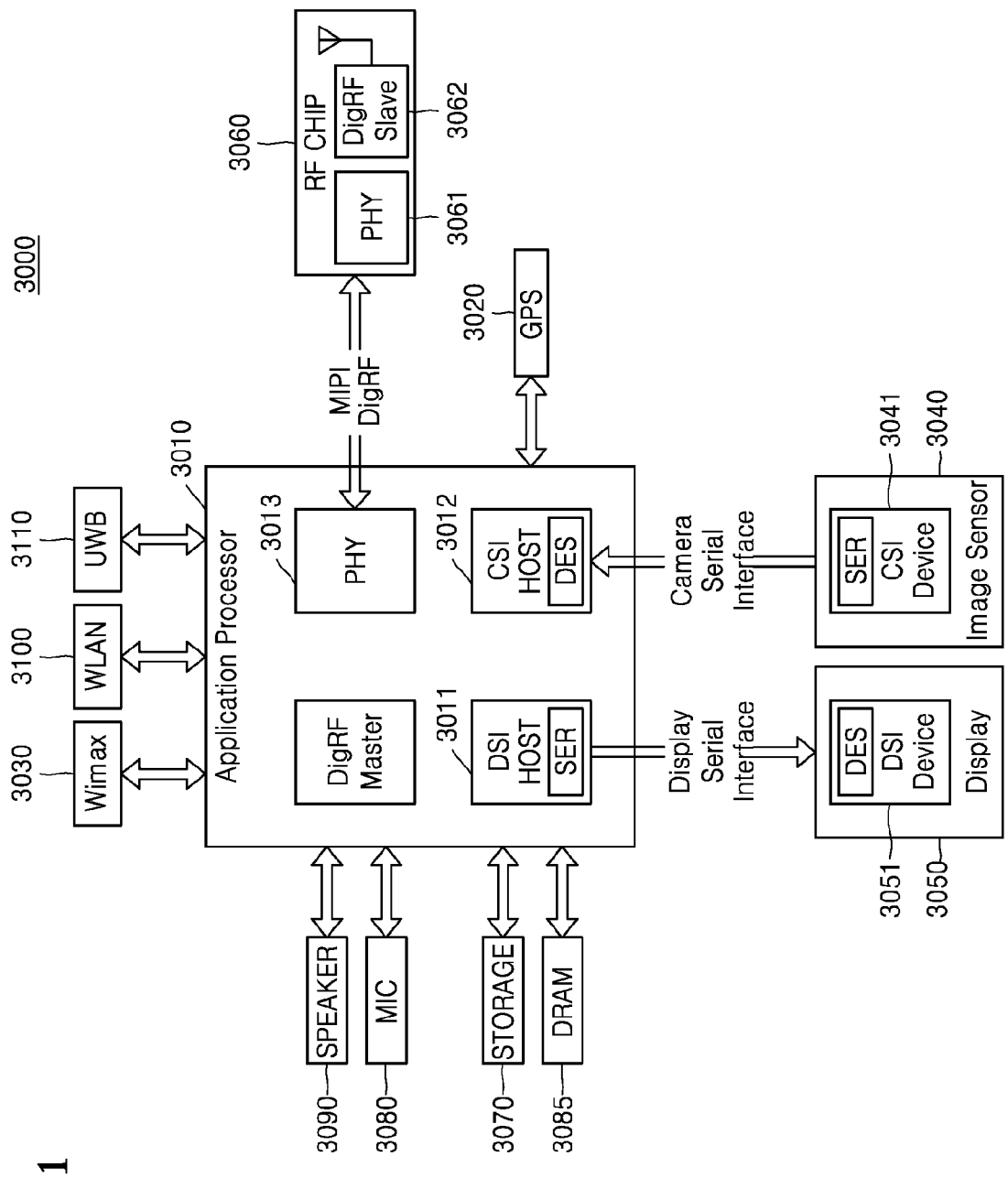
FIG. 11 is a block diagram of an electronic system including an image sensor and an interface, according to an embodiment of the inventive concept.

FIG. 11 is a block diagram of an electronic system 3000 including an image sensor 3040 and an interface, according to an embodiment of the inventive concept. Referring to FIG. 11, the electronic system 3000 may be embodied as a data processing apparatus that may use or support a mobile industry processor interface (MIPI), for example, a mobile phone, a personal digital assistant (PDA), a portable multimedia player (PMP), or a smartphone. The electronic system 3000 may include an application processor 3010, an image sensor 3040, and a display unit 3050.

A camera serial interface (CSI) host 3012 that is included in the application processor 3010 may sequentially communicate with a CSI device 3041 of the image sensor 3040 via a CSI. In this case, for example, a light deserializer may be provided in the CSI host 3012, and a light serializer may be provided in the CSI device 3041.

A display serial interface (DSI) host 3011 that is provided in the application processor 3010 may sequentially communicate with a DSI device 3051 of the display unit 3050 via a DSI. In this case, for example, the light serializer may be provided in the DSI host 3011, and the light deserializer may be provided in the DSI device 3051.

The electronic system 3000 may further include a radio frequency (RF) chip 3060 that may communicate with the application processor 3010. A physical layer (PHY) 3013 of the application processor 3010 and a PHY 3061 of the RF chip 3060 may transmit/receive data according to MIPI DigRF.

The electronic system 3000 may further include a global positioning system (GPS) 3020, a storage unit 3070, a microphone (MIC) 3080, dynamic random-access memory (DRAM) 3085, and a speaker 3090. The electronic system 3000 may communicate by using worldwide interoperability for microwave access (Wimax) 3030, a wireless local area network (WLAN) 3100, and ultra-wideband (UWB) 3110.

While the inventive concept has been particularly shown and described with reference to exemplary embodiments thereof using specific terms, the embodiments and terms have been used to explain the inventive concept and should not be construed as limiting the scope of the inventive concept defined by the claims. Accordingly, it will be understood by those of ordinary skill in the art that various changes in form and details may be made therein without departing from the spirit and scope of the inventive concept as defined by the following claims.

What is claimed is:

1. A unit pixel of an image sensor, the unit pixel comprising:
   a color filter layer having a first surface;
   a photo-electric conversion region in a semiconductor layer and which accumulates electric charges according to incident light that passes through the color filter layer, the photo-electric conversion region contacting a front surface of the semiconductor layer, and the photo-electric conversion region being spaced a distance from the first surface of the color filter layer;
   a charge storage region in the semiconductor layer and which stores the accumulated electric charges, the charge storage region being laterally spaced apart from the photo-electric conversion region, and the charge storage region contacting the front surface of the semiconductor layer; and
   a light-blocking shield film on or above the charge storage region that prevents the incident light that passes through the color filter layer from propagating to the charge storage region,
   wherein the semiconductor layer has a back surface that faces towards the first surface of the color filter layer, and the front surface of the semiconductor layer is opposite the back surface and is coplanar with surfaces of the photo-electric region and the charge storage region,
   at least a portion of the shield film extends horizontally parallel to the first surface of the color filter layer as interposed between the color filter layer and the charge storage region,
   said portion of the shield film is spaced a distance from the first surface of the color filter layer and is spaced a distance from the front surface of the semiconductor layer, and
   the distance by which said portion of the shield film is spaced from the first surface of the color filter layer is greater than the distance by which the photo-electric conversion region is spaced from the first surface of the color filter layer.

2. The unit pixel of claim 1, wherein the distance by which said portion of the shield film is spaced from the front surface of the semiconductor layer is 0.2 µm to 1 µm.

3. The unit pixel of claim 2, wherein the shield film has a second portion extending vertically toward the first surface of the color filter layer adjacent to a side of the photo-electric conversion region.

4. The unit pixel of claim 1, further comprising an insulating film that is interposed between the charge storage region and the shield film.

5. The unit pixel of claim 1, further comprising:
   a material layer that is interposed between the shield film and the color filter layer; and
   a lens that is disposed on a second surface of the color filter layer that is opposite the first surface of the color filter layer.

6. The unit pixel of claim 1, further comprising a floating diffusion region to which the accumulated electric charges stored in the charge storage region are transmitted and that is laterally spaced apart from the first surface of the color filter layer, wherein said portion of the shield film is interposed between the floating diffusion region and the color filter layer.

7. The unit pixel of claim 1, wherein the shield film comprises a metal.

8. The unit pixel of claim 1, further comprising an organic photoelectric conversion layer that is disposed on a second surface of the color filter layer opposite the first surface of the color filter layer.

9. A portable electronic device comprising:
an application processor;
and an image sensor configured to generate image data according to a control of the application processor, the image sensor comprising:
a pixel array comprising a plurality of unit pixels configured to generate a plurality of pixel signals according to incident light,
and a signal processor configured to generate image data based on the generated plurality of pixel signals,
wherein a unit pixel among the plurality of unit pixels of the pixel array comprises:
a color filter layer having a first surface;
a photo-electric conversion region that accumulates electric charges according to incident light that passes through the color filter layer, the photo-electric conversion region being spaced a distance from a first surface of the color filter layer;
a charge storage region that stores the accumulated electric charges and is laterally spaced apart from the photo-electric conversion region;
and a light-blocking shield film on or above a charge storage region that prevents the incident light that passes through the color filter layer from propagating to the charge storage region,
wherein at least a portion of the shield film extends horizontally parallel to the first surface of the color filter layer as interposed between the color filter layer and the charge storage region,
said portion of the shield film is spaced a distance from the first surface of the color filter layer,
and the distance by which said portion of the shield film is spaced from the first surface of the color filter layer is greater than the distance by which photo-electric conversion region is spaced from the first surface of the color filter layer.

10. The portable electronic device as claimed in claim 9, further comprising a dynamic random access memory (DRAM).

11. The portable electronic device as claimed in claim 10, further comprising:
a display device,
wherein the display device is configured to communicate with the image sensor via the application processor.

12. The portable electronic device as claimed in claim 11, wherein each of the plurality of unit pixels includes an organic photoelectric conversion layer that is disposed between the color filter layer and a lens.

13. The portable electronic device as claimed in claim 11, wherein each of the plurality of unit pixels includes a floating diffusion region to which the electric charges stored in the charge storage region are transmitted and that is spaced apart from the first surface of the color filter layer,
wherein the shield film extends to be disposed between the floating diffusion region and the color filter layer.

14. An image sensor comprising:
a plurality of unit pixels;
a row driver configured to output a row signal to the plurality of unit pixels; and
a pixel signal processing unit configured to receive an output voltage that is output from at least one unit pixel among the plurality of unit pixels and to measure a magnitude of the output voltage,
wherein each of the plurality of unit pixels includes:
a semiconductor layer having a first surface and a second surface, the first surface facing the second surface;
a transistor layer disposed on the first surface of the semiconductor layer;
an insulating film disposed on the second surface of the semiconductor layer;
a shield film disposed on the insulating film;
a material layer disposed on the second surface of the semiconductor layer and on the shield film such that a first portion of the material layer contacts the second surface of the semiconductor layer and a second portion of the material layer contacts the shield film, the material layer being configured to insulate the semiconductor layer from an external material;
a color filter layer disposed on the material layer;
a lens disposed on the color filter layer;
a charge storage device disposed in the semiconductor layer, the charge storage device being configured to temporarily store electric charges; and
a light detection device disposed in the semiconductor layer, the light detection device being configured to absorb light and to accumulate the electric charges.

15. The image sensor of claim 14, wherein the semiconductor layer includes a first portion and a second portion,
the charge storage device is disposed in the first portion of the semiconductor layer,
the light detection layer is disposed in the second portion of the semiconductor layer, and
the insulating film is disposed on the second surface of the first portion of the semiconductor layer such that the insulating film and the shield film are disposed above the charge storage device.

16. The image sensor of claim 15, wherein the shield film extends toward a first surface of the color filter layer along a side surface of the light detection device, and
the shield film further extends along the second surface of the second portion of the semiconductor layer.

17. The image sensor of claim 16, wherein the shield film comprises an opening through which the light passes to the light detection device, and
the opening is disposed between the color filter layer and the light detection device.

18. The image sensor of claim 14, wherein each of the plurality of unit pixels includes a floating diffusion to which the electric charges stored in the charge storage device are transmitted.

19. The image sensor of claim 14, wherein each of the plurality of unit pixels includes an organic photoelectric conversion layer that is disposed between the color filter layer and the lens.

20. The image sensor of claim 14, wherein each of the plurality of unit pixels includes trenches extending from the first surface of the semiconductor layer toward the second surface of the semiconductor layer, the trenches blocking charge transfer between the adjacent unit pixels.

* * * * *